(12) United States Patent
Yamamoto

(10) Patent No.: US 9,748,978 B2
(45) Date of Patent: Aug. 29, 2017

(54) CRC CODE CALCULATION CIRCUIT AND METHOD THEREOF, AND SEMICONDUCTOR DEVICE

(71) Applicant: FUJITSU LIMITED, Kawasaki-shi, Kanagawa (JP)

(72) Inventor: Masaki Yamamoto, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/071,804

(22) Filed: Mar. 16, 2016

(65) Prior Publication Data
US 2016/0306692 A1    Oct. 20, 2016

(30) Foreign Application Priority Data

Apr. 14, 2015   (JP) .................................. 2015-082592

(51) Int. Cl.
*H03M 13/00* (2006.01)
*H03M 13/03* (2006.01)
*H03M 13/09* (2006.01)

(52) U.S. Cl.
CPC ..... *H03M 13/6516* (2013.01); *H03M 13/091* (2013.01)

(58) Field of Classification Search
CPC ............ H03M 13/6516; H03M 13/091; H04L 1/0052; H04L 1/0061; G06F 11/10
See application file for complete search history.

(56) References Cited

U.S. PATENT DOCUMENTS

| | | | |
|---|---|---|---|
| 6,192,498 B1* | 2/2001 | Arato | H03M 13/09 714/758 |
| 2004/0187062 A1 | 9/2004 | Kajita | |
| 2009/0106631 A1 | 4/2009 | Shigihara et al. | |
| 2014/0026021 A1* | 1/2014 | Hill | G06F 11/1004 714/807 |
| 2016/0147595 A1* | 5/2016 | Licardie | H04B 7/0882 714/807 |

FOREIGN PATENT DOCUMENTS

| | | |
|---|---|---|
| JP | 2001-308720 | 11/2001 |
| JP | 2001-358594 | 12/2001 |
| JP | 2002-359561 | 12/2002 |
| JP | 2003-46393 | 2/2003 |
| JP | 2009-55407 | 3/2009 |

* cited by examiner

*Primary Examiner* — Christine Tu
(74) *Attorney, Agent, or Firm* — Staas & Halsey LLP

(57) ABSTRACT

A CRC code calculation circuit including: an extraction circuit that extracts a calculation target packet that is a target of CRC calculation from a signal frame inputted as a parallel signal of a first bit length; a shift circuit that generates, when a bit length of the calculation target packet does not match an integral multiple of the first bit length, data A of a bit length that is the integral multiple of the first bit length by shifting the calculation target packet such that a last bit of the calculation target packet is positioned at a least significant bit, and adding "0" to a most significant bit side of a head bit of the shifted calculation target packet; and a calculation circuit that generates a CRC code by performing a CRC calculation on the data A based on an initial value "0" stored in a register.

9 Claims, 17 Drawing Sheets

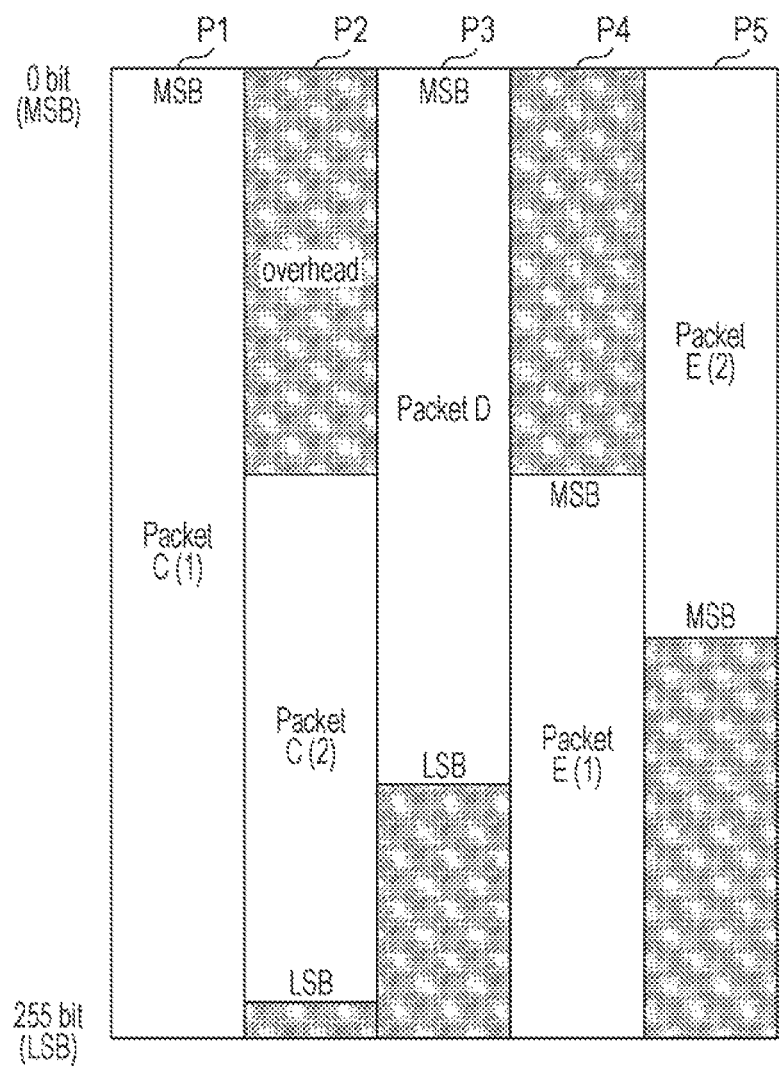

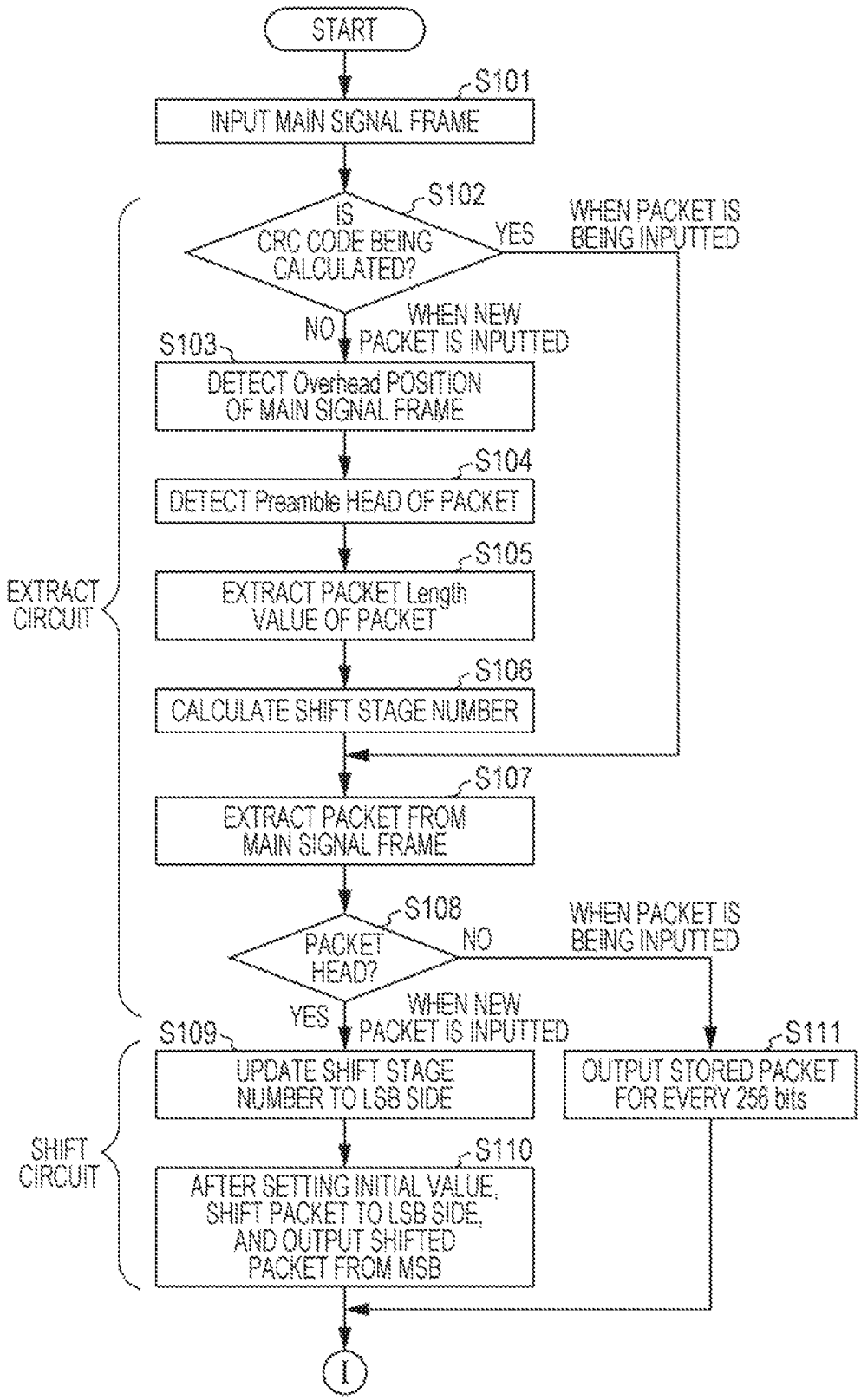

CRC CODE CALCULATION CIRCUIT AND METHOD THEREOF, AND SEMICONDUCTOR DEVICE

CROSS-REFERENCE TO RELATED APPLICATION

This application is based upon and claims the benefit of priority of the prior Japanese Patent Application No. 2015-082592, filed on Apr. 14, 2015, the entire contents of which are incorporated herein by reference.

FIELD

The embodiments discussed herein are related to a CRC code calculation circuit and a method thereof, and a semiconductor device.

BACKGROUND

In data transmission systems (transmission apparatuses), known is a cyclic redundancy check (CRC) method as a method of determining whether an error is present in received data (for example, see Japanese Laid-open Patent Publication Nos. 2001-308720 and 2001-358594). In the CRC method, a transmitter transmits a frame signal in which a frame check sequence (FCS), into which a CRC code obtained by calculating the data is embedded, is added to data to be transmitted. Meanwhile, a receiver calculates data that is extracted from the received frame signal to generate a CRC code, and determines that no error is present in the transmitted data when the generated CRC code matches the CRC code that is embedded into the FCS.

To achieve high speed calculation for generating a CRC code, known is a method in which a received frame signal is serial-parallel converted, and the serial-parallel converted data is calculated (for example, see Japanese Laid-open Patent Publication Nos. 2009-55407, 2003-46393, and 2002-359561).

When a frame signal that includes packets having different bit lengths is serial-parallel converted and calculated, a CRC code is generated using CRC code calculation circuits in accordance with the bit lengths of the respective packets. However, there has been a problem in that in a case of generating a CRC code using CRC code calculation circuits in accordance with the bit lengths, when a serial-parallel converted packet has a long bit length, the number of the CRC code calculation circuits to be arranged is increased, leading to an increase in the size of the circuit.

One embodiment aims to provide a CRC code calculation circuit capable of calculating packets that are parallel signals having different bit lengths, with a comparatively small-sized circuit size, and generating a CRC code.

SUMMARY

According to an aspect of the invention, a CRC code calculation circuit includes: an extraction circuit that extracts a calculation target packet that is a target of CRC calculation from a signal frame inputted as a parallel signal of a first bit length; a shift circuit that generates, when a bit length of the calculation target packet does not match an integral multiple of the first bit length, data A of a bit length that is the integral multiple of the first bit length by shifting the calculation target packet such that a last bit of the calculation target packet is positioned at a least significant bit, and adding "0" to a most significant bit side of a head bit of the shifted calculation target packet; and a calculation circuit that generates a CRC code by performing a CRC calculation on the data A based on an initial value "0" stored in a register.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating an example a parallel signal in a case where the CRC code calculation circuit illustrated in FIG. 2B generates an incorrect CRC code;

FIGS. 11A and 11B are illustrating a flowchart of processing in which the CRC code calculation circuit illustrated in FIG. 6 generates a CRC code;

DESCRIPTION OF EMBODIMENTS

Hereinafter, a CRC code calculation circuit and a method thereof, and a semiconductor device according to the present disclosure will be described with reference to the drawings. Note that, the technical range of the present disclosure is not limited to embodiments.

A CRC code calculation circuit according to the embodiments shifts a packet that is inputted as a parallel signal such that a last bit of the packet is positioned at an least significant bit (LSB), and generates a CRC code from shift data having a predetermined bit length in which "0" is added at a most significant bit (MSB) side of the packet. Shifting a packet to the LSB side and adding "0" to the MSB side of the packet to make the number of bits of shift data be an integral multiple of that of the parallel signal in this manner allows a CRC code of packets having different bit lengths to be generated with a small sized circuit.

Prior to an explanation of a CRC code calculation circuit and a method thereof, and a semiconductor device according to the embodiments, one example of a CRC code calculation circuit will be described.

(One Example of System Including Semiconductor Device to which CRC Code Calculation Circuit is Mounted)

Figure 1A:
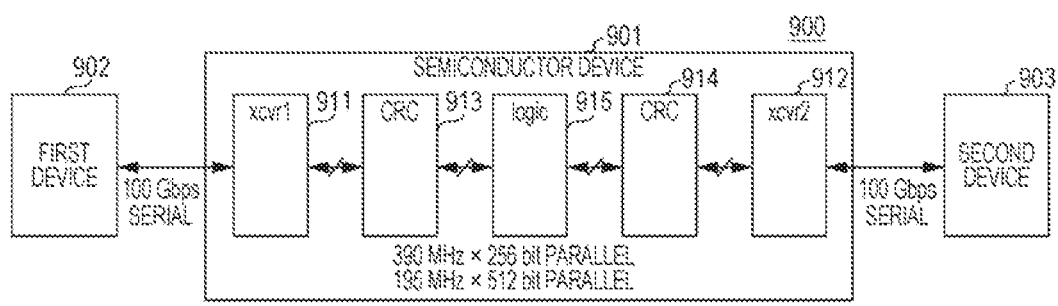
FIG. 1A is a diagram illustrating one example of a conventional system including a semiconductor device on which a CRC code calculation circuit is mounted.
Figure 1B:
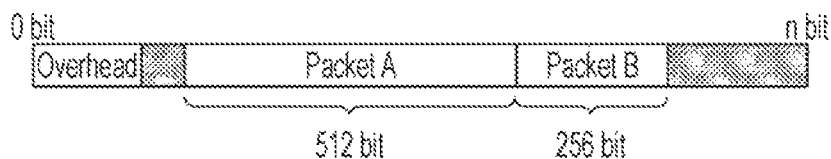
FIG. 1B is a diagram illustrating one example of a serial signal that is transmitted by the system illustrated in FIG. 1A.
Figure 1C:
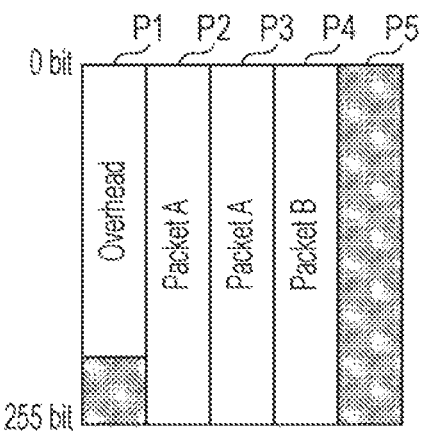
FIG. 1C is a diagram illustrating one example of a parallel signal that is converted by the semiconductor device illustrated in FIG. 1A.
Figure 1D:
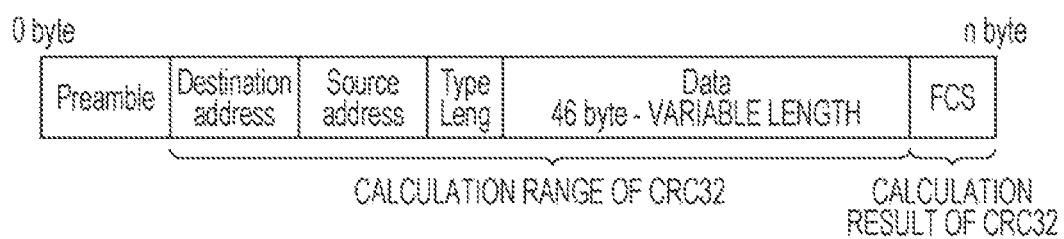
FIG. 1D is a diagram illustrating one example of a format of a packet that is transmitted by the system illustrated in FIG. 1A.

FIG. 1A is a diagram illustrating one example of a conventional system including a semiconductor device to which a CRC code calculation circuit is mounted. FIG. 1B is a diagram illustrating one example of a serial signal that is transmitted by the system illustrated in FIG. 1A, and FIG. 1C is a diagram illustrating one example of a parallel signal that is converted by the semiconductor device illustrated in FIG. 1A. FIG. 1D is a diagram illustrating one example of a format of a packet that is transmitted by the system illustrated in FIG. 1A.

A system 900 includes a semiconductor device 901 that is a field-programmable gate array (FPGA), a first device 902, and a second device 903, as one example. Each of the semiconductor device 901, the first device 902, and the second device 903 is a semiconductor device that allows signals to be serially transmitted at 100 Gbps. The semiconductor device 901 includes a first communication circuit 911, a second communication circuit 912, a first CRC circuit 913, a second CRC circuit 914, and a logic circuit 915. The semiconductor device 901 is, for example, an FPGA in a transmission apparatus that handles high-speed high-capacity main signal data.

The first communication circuit 911 coverts a signal that is serially transmitted from the first device 902 at 100 Gbps to a parallel signal of 256 bits and a transmission speed of 390 Mbps. Note that, an example in which a signal is converted to a parallel signal of 256 bits will be herein described; however, the parallel signal may preferably have a bit length other than 256 bits. For example, a signal may preferably be converted to a parallel signal of 512 bits and a transmission speed of 195 Mbps. The first CRC circuit 913 calculates the signal that is converted to the parallel signal to generate a CRC code. The logic circuit 915 subjects predetermined processing to the parallel signal from which the CRC code is generated in the first CRC circuit 913, and outputs the processed parallel signal to the second CRC circuit 914. The second CRC circuit 914 embeds an FCS into data that is subjected to the predetermined processing in the logic circuit 915, and outputs the parallel signal to the second communication circuit 912. The second communication circuit 912 converts the parallel signal into which the FCS is embedded to a serial signal of 100 Gbps, and transmits the serial signal to the second device 903. Meanwhile, a signal that is transmitted from the second device 903 is converted to a parallel signal in the second communication circuit 912. Next, the signal that is converted to the parallel signal is processed in the second CRC circuit 914, the logic circuit 915, and the first CRC circuit 913, and thereafter, the processed parallel signal is converted to a serial signal and is transmitted to the first device 902, in and by the first communication circuit 911.

When receiving a main signal frame that is a serial signal illustrated in FIG. 1B, for example, each of the first communication circuit 911 and the second communication circuit 912 converts the serial signal to a parallel signal having a bit length of 256 bits illustrated in FIG. 1C. The main signal frame includes an overhead, a packet A of 512 bits that is received subsequent to the overhead, and a packet B of 256 bits that is received subsequent to the packet A. The bit length of the packet A is twice as long as the bit length of the parallel signal after the conversion, so that when being converted to the parallel signal, the packet A is divided into two parallel signals of a second parallel signal P2 and a third parallel signal P3. Meanwhile, the bit length of the packet B is the same as the bit length of the parallel signal after conversion, so that the packet B is converted to a fourth parallel signal P4.

As illustrated in FIG. 1D, a packet in the Ethernet (registered trademark) includes a preamble, a destination address, a transmission source address, a length/type, data, and an FCS. The first CRC circuit 913 and the second CRC circuit 914 each calculate, in the packet illustrated in FIG. 1D, a calculation target packet including a destination address, a transmission source address, a length/type, and data to generate a CRC code. The generated CRC code is embedded into the FCS.

Figure 2A:
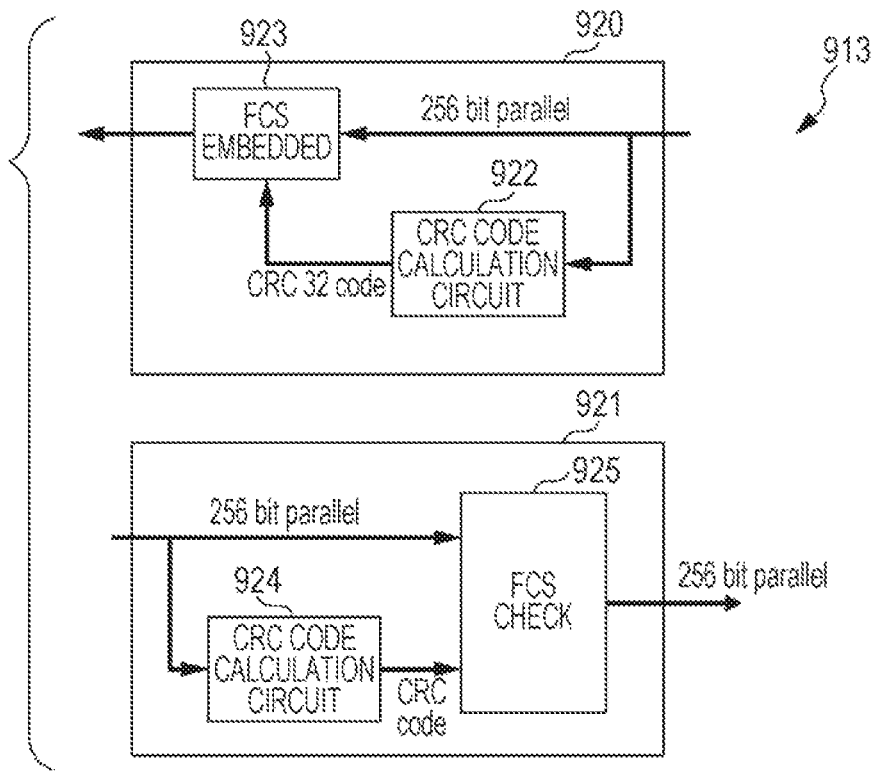
FIG. 2A is a circuit block diagram of a first CRC circuit illustrated in FIG. 1A.
Figure 2B:
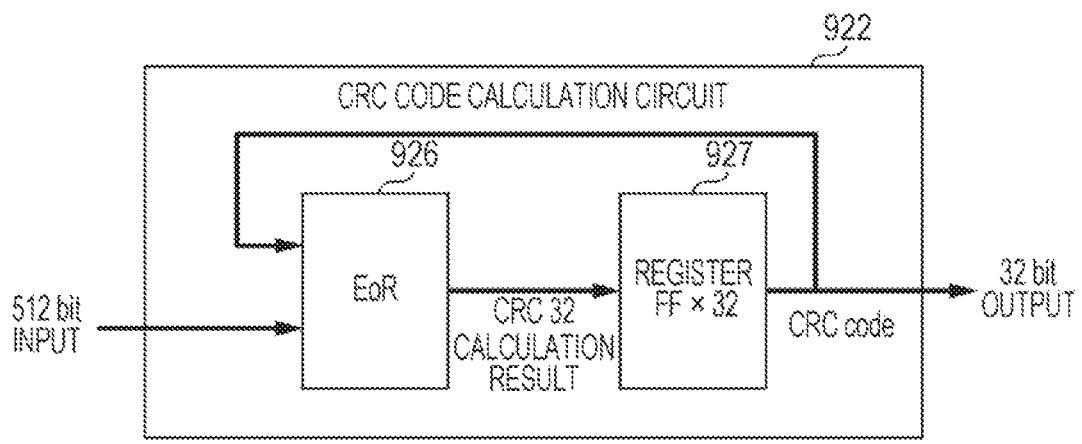
FIG. 2B is an inner block diagram of a CRC code calculation circuit illustrated in FIG. 2A.

FIG. 2A is a circuit block diagram of the first CRC circuit 913, and FIG. 2B is an inner block diagram of a CRC code calculation circuit illustrated in FIG. 2A.

The first CRC circuit 913 includes a CRC transmission unit 920, and a CRC reception unit 921. The CRC transmission unit 920 includes a CRC code calculation circuit 922, and an FCS embedded circuit 923. The CRC code calculation circuit 922 generates a CRC code, and the FCS embedded circuit 923 embeds the CRC code generated by the CRC code calculation circuit 922 into an FCS of a packet, and outputs the packet with the FCS into which the CRC code is embedded to the first communication circuit 911. The CRC reception unit 921 includes a CRC code calculation circuit 924 having the same configuration as the CRC code calculation circuit 922, and an FCS check circuit 925. The CRC code calculation circuit 924 calculates the packet inputted from the first communication circuit 911, generates a CRC code, outputs the CRC code to the FCS check circuit 925. The FCS check circuit 925 compares the CRC code that is embedded into the FCS of the packet inputted from the first communication circuit 911 with the CRC code generated by the CRC code calculation circuit 924 to check the normality of the packet.

The CRC code calculation circuit 922 includes an EoR (Exclusive OR) circuit 926, and a register 927. The EoR circuit 926 uses an initial value of 32 bits that is stored in a register and a parallel signal of 256 bits that is inputted to execute calculation based on a CRC32 generating polynomial expressed by an expression (1).

$$x^{32}+x^{26}+x^{23}+x^{22}+x^{16}+x^{12}+x^{11}+x^{10}+x^{8}+x^{7}+x^{5}+x^{4}+x^{2}+x+1 \quad (1)$$

The CRC code calculation circuit 922 is capable of generating a CRC code when the packet length is an integral multiple of the bit length of the parallel signal as in the packets A and B and a head bit of the packet matches a most significant bit (MSB) of the parallel signal. However, when a packet of a bit variable length is transmitted in the Ethernet or the like and a head bit of the packet does not match the MSB of the parallel signal, there is a possibility that the CRC code calculation circuit 922 may generate an incorrect CRC code.

FIG. 3 is a diagram illustrating an example a parallel signal in a case where the CRC code calculation circuit 922 generates an incorrect CRC code.

A packet C is divided into two portions by an overhead. The portion at a head bit side of the packet C has a bit length of 256 bits and is included in a first parallel signal P1, and the portion at a last bit side thereof is included in a second parallel signal P2. As the packet C includes an overhead between the portions at the head bit side and the last bit side, there is a possibility that the CRC code calculation circuit 922 may generate an incorrect CRC code.

A packet D has a head bit that is positioned at 0 bit of a third parallel signal P3, and a last bit that is not positioned at a least significant bit (LSB) of the third parallel signal P3 because the packet D has a bit length shorter than 256 bits. There is a possibility that the CRC code calculation circuit 922 may generate an incorrect CRC code for the packet D because the last bit does not match the LSB of the third parallel signal P3.

A packet E has a head bit that is not positioned at an MSB of a fourth parallel signal P4. Moreover, the packet E has a last bit that is not positioned at an LSB of a fifth parallel signal P5. There is a possibility that the CRC code calculation circuit 922 may generate an incorrect CRC code because at the head side of the packet E that is arranged in the fourth parallel signal P4, the head bit is not positioned at the MSB of the fourth parallel signal P4. There is a possibility that the CRC code calculation circuit 922 may generate an incorrect CRC code because at the last side of the packet E that is arranged in the fifth parallel signal P5, the last bit is not positioned at the LSB of the fifth parallel signal P5.

Figure 4A:
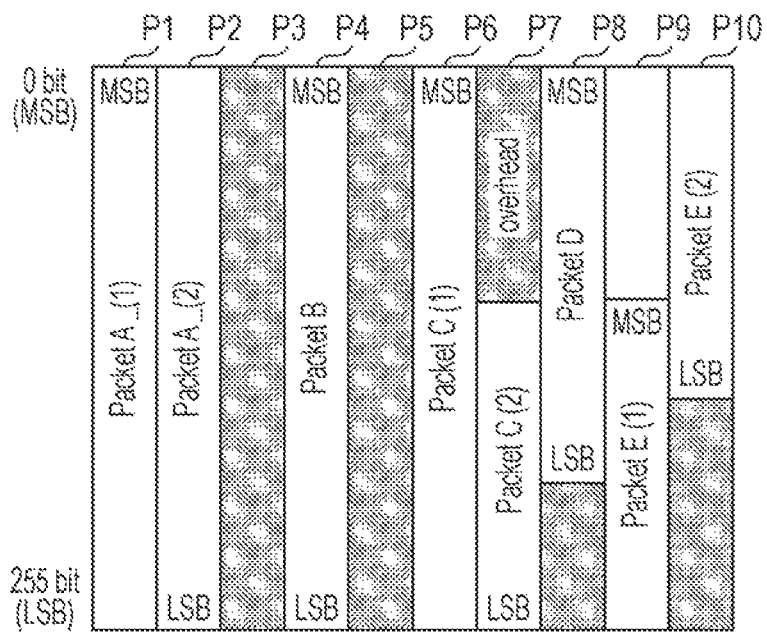
FIG. 4A is a diagram illustrating one example of a parallel signal that is inputted into the CRC code calculation circuit.
Figure 4B:
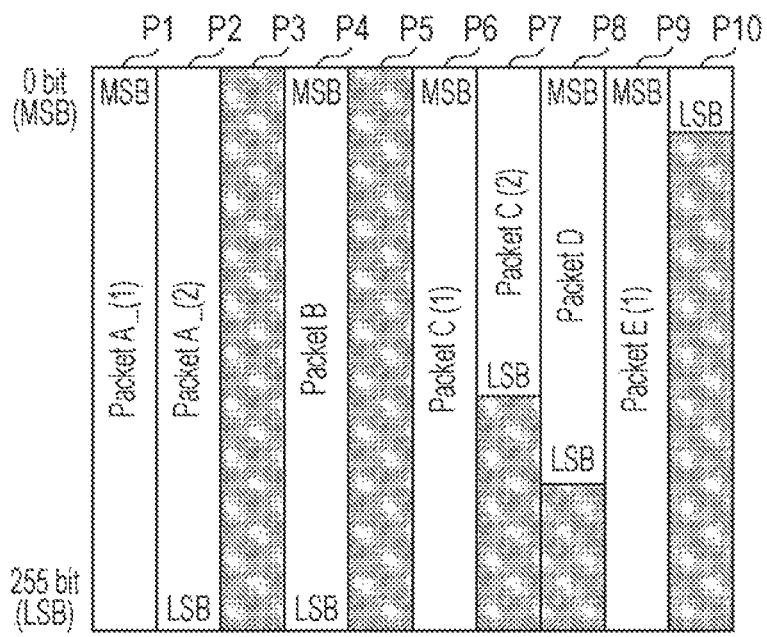
FIG. 4B is a diagram illustrating one example of a parallel signal that is converted by the CRC code calculation circuit.
Figure 4C:
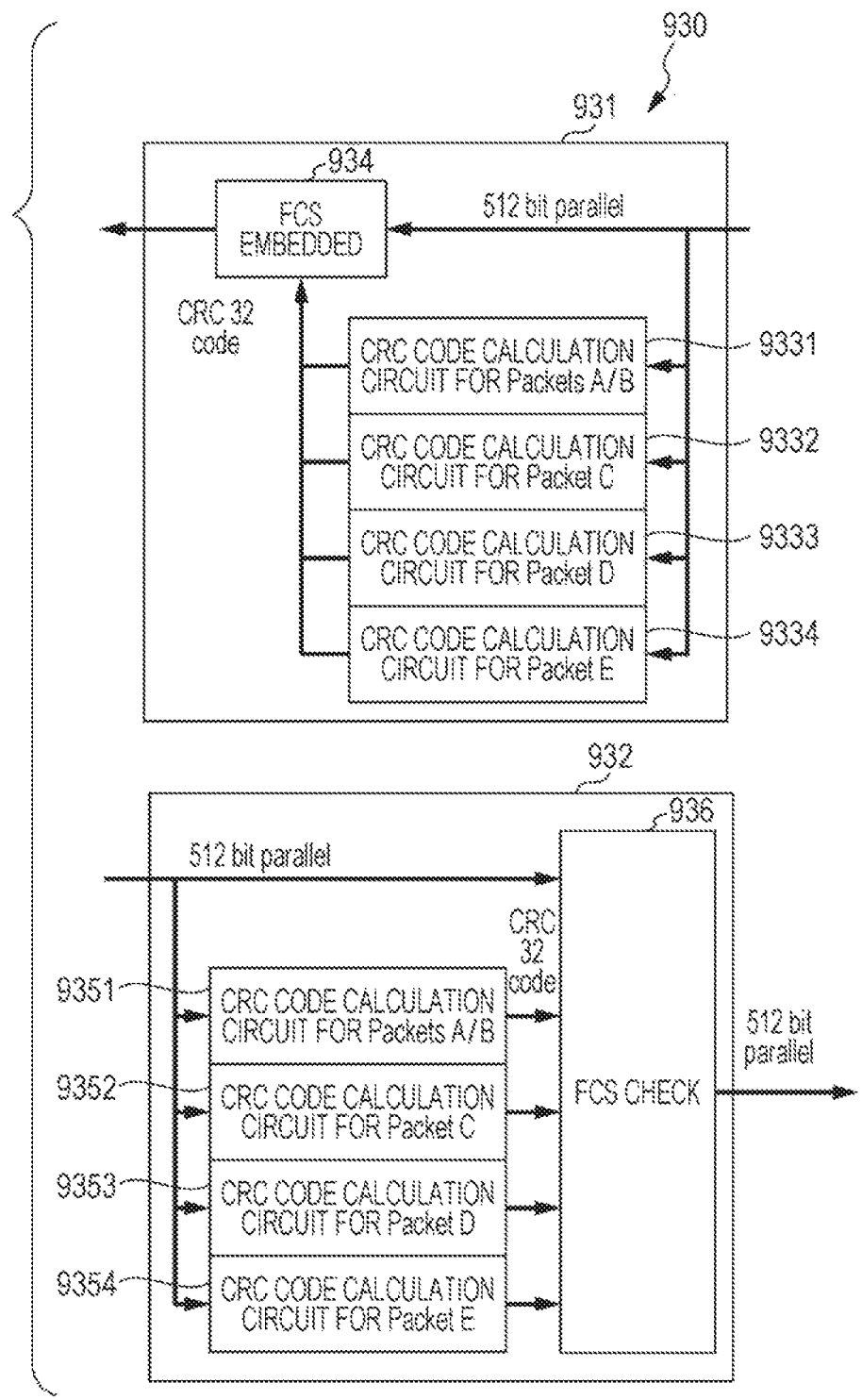
FIG. 4C is a circuit block diagram of a CRC code calculation circuit that is capable of generating a CRC code of the parallel signal illustrated in FIG. 4A.

FIG. 4A is a diagram illustrating one example of a parallel signal that is inputted into a CRC code calculation circuit, and FIG. 4B is a diagram illustrating one example of the parallel signal that is converted by the CRC code calculation circuit. FIG. 4C is a circuit block diagram of a CRC code calculation circuit that is capable of generating a CRC code of the parallel signal illustrated in FIG. 4A.

A packet A has a bit length of 512 bits, and has a head bit that is positioned at an MSB of a first parallel signal P1 and a last bit that is positioned at an LSB of a second parallel signal P2. A packet B has a bit length of 256 bits, and has a head bit that is positioned at an MSB of a fourth parallel signal P4 and a last bit that is positioned at an LSB of the fourth parallel signal P4. A packet C is divided into two portions by an overhead, and the portion at a head bit side has a bit length of 256 bits and is included in a sixth parallel signal P6. The portion at a last bit side of the packet C is included in a seventh parallel signal P7. A packet D has a head bit that is positioned at an MSB of an eighth parallel signal P8, and a last bit is positioned at a middle level of the eighth parallel signal P8. A packet E has a head bit that is positioned at a middle level of a ninth parallel signal P9, and a last bit that is positioned at a middle level of a tenth parallel signal P10.

A CRC code calculation circuit 930 includes a CRC transmission unit 931, and a CRC reception unit 932. The CRC transmission unit 931 includes a first CRC code calculation circuit 9331 to a fourth CRC code calculation circuit 9334, and an FCS embedded circuit 934. The first CRC code calculation circuit 9331 generates CRC codes for the packets A and B, and the second CRC code calculation circuit 9332 generates a CRC code for the packet C. When generating a CRC code for the packet C, the second CRC code calculation circuit 9332 shifts the packet C included in the seventh parallel signal P7 in a direction toward 0 bit, in other words, in the MSB direction. The third CRC code calculation circuit 9333 generates a CRC code for the packet D, and the fourth CRC code calculation circuit 9334 generates a CRC code for the packet E. When generating a CRC code for the packet E, the fourth CRC code calculation circuit 9334 shifts the packet E included in the ninth parallel signal in the MSB direction, and shifts bits of the packet E included in the tenth parallel signal P10 to the ninth parallel signal P9. The FCS embedded circuit 934 embeds the CRC codes respectively generated by the first CRC code calculation circuit 9331 to the fourth CRC code calculation circuit 9334 into the FCSs of the packets, and outputs the packets with the FCSs into which the CRC codes are embedded. The CRC reception unit 921 includes a first CRC code calculation circuit 9351 to a fourth CRC code calculation circuit 9354 respectively having the same configurations as the first CRC code calculation circuit 9331 to the fourth CRC code calculation circuit 9334, and an FCS check circuit 936. The first CRC code calculation circuit 9351 calculates the packets A and B inputted from the first communication circuit 911, generates CRC codes, and outputs the CRC codes to the FCS check circuit 936. The second CRC code calculation circuit 9352 to the fourth CRC code calculation circuit 9354 respectively calculate the packets C to E inputted from the first communication circuit 911, generate CRC codes, and output the CRC codes to the FCS check circuit 936. The FCS check circuit 936 compares CRC codes embedded into the FCSs of the inputted packets with the CRC codes that are respectively generated by the first CRC code calculation circuit 9351 to the fourth CRC code calculation circuit 9354.

The CRC code calculation circuit 930 may calculate any packet of the packets A to E illustrated in FIG. 4A, however, prepares CRC code calculation circuits corresponding respectively to the packets A to E to cause a problem of upsizing of the circuit.

In addition, in a case where a packet having a variable bit length is transmitted in the Ethernet or the like, there is a possibility that the bit length may be shifted in the byte unit, for example. When a parallel signal of 256 bits at the maximum, in other words, of 32 bytes, is inputted, thirty two EoR calculation circuits that respectively process parallel signals having a length of 1 byte to a length of 32 bytes are arranged in the CRC code calculation circuit 930.

Figure 5:
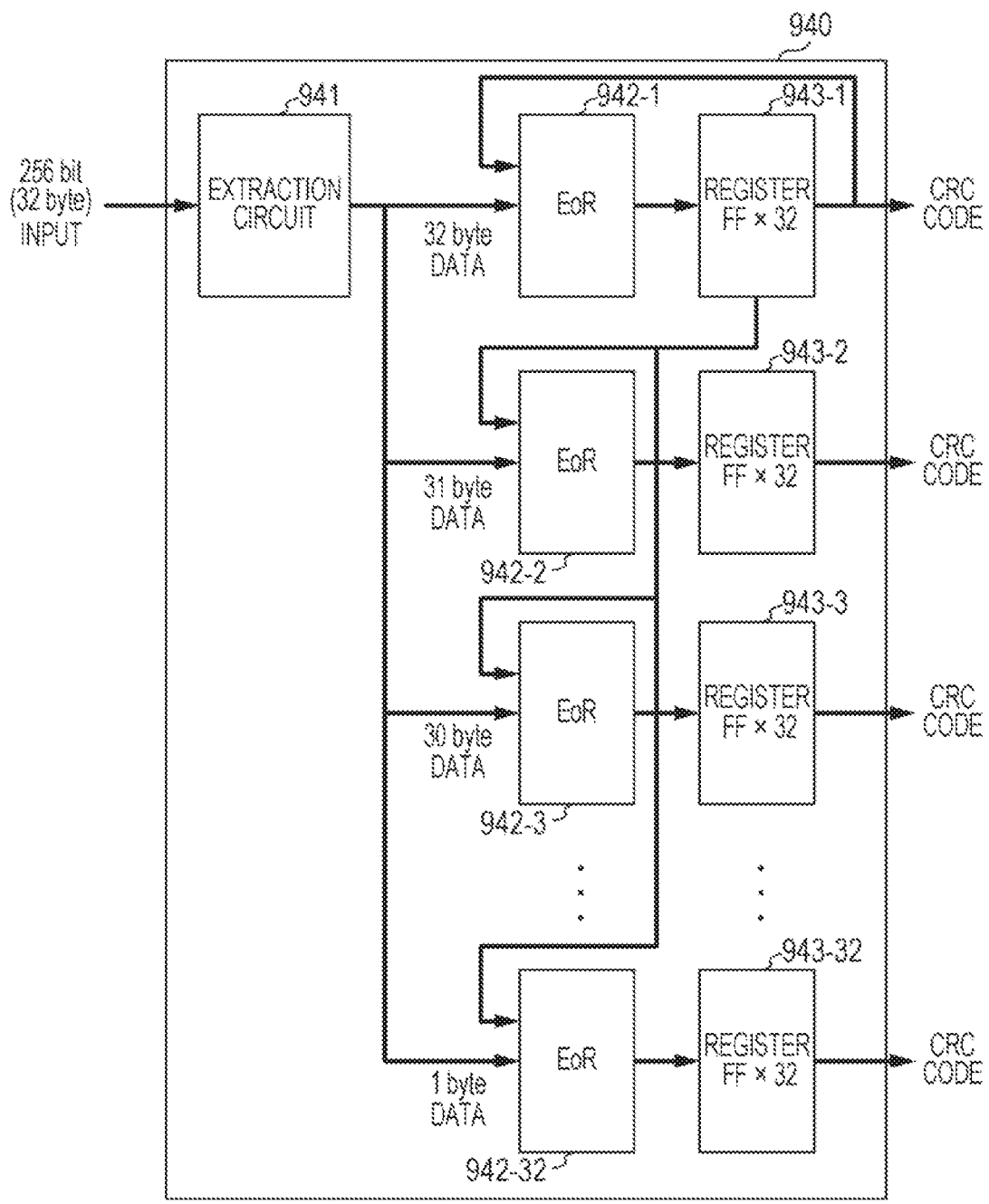
FIG. 5 is a circuit block diagram of a CRC code calculation circuit capable of processing parallel signals having a length of 1 byte to a length of 32 bytes.

FIG. 5 is a circuit block diagram of a CRC code calculation circuit capable of processing parallel signals having a length of 1 byte to a length of 32 bytes.

A CRC code calculation circuit 940 includes an extraction circuit 941, a first EoR circuit 942-1 to a thirty-second EoR circuit 942-32, and a first register 943-1 to a thirty-second register 943-32. The extraction circuit 941 extracts a group of calculation target packets included in packets, from a frame signal that is converted to a parallel signal. The group of calculation target packets may have a bit length longer than 256 bits or shorter than 256 bits. Moreover, the extraction circuit 941 counts a bit length of extracted data, and outputs the extracted calculation target packet to any of the first EoR circuit 942-1 to the thirty-second EoR circuit 942-32 in accordance with the bit length of the extracted data. The first register 943-1 to the thirty-second register 943-32 respectively execute calculation based on the CRC32 generating polynomial expressed by the expression (1) with respect to the calculation target packets inputted from the extraction circuit 941. When the extracted calculation target packet has a bit length longer than 32 bytes, the CRC code calculation circuit 940 executes the calculation for every 32 bytes in the first EoR circuit 942-1. For example, when a calculation target packet has a bit length of 356 bits, the calculation target packet of 256 bits from the MSB is calculated in the first EoR circuit 942-1, and the calculation target packet of the remaining 100 bits is calculated in other EoR circuits. The CRC code calculation circuit 940 executes the calculation on another packet, the bit length of which is shorter than 32 bytes, in any of the second register 943-2 to the thirty-second register 943-32 in accordance with the bit length of the calculation target packet. Namely, when the packet has 31 byte length, the calculation is executed in the second EoR circuit 942-2.

The CRC code calculation circuit 940 may generate CRC codes for any parallel signals having a length of 1 byte to a length of 32 bytes, however, thirty two pairs of EoR circuits and registers are arranged, thereby causing a problem of upsizing of the circuit.

The abovementioned circuit has a problem of upsizing the calculation circuit that generates a CRC code from a packet asynchronous to the main signal frame, a packet that includes an overhead of the main signal frame, a packet a head bit of which does not match an LSB of the main signal frame, or the like.

(Configuration and Function of Semiconductor Device and CRC Code Calculation Circuit According to First Embodiment)

Figure 6:
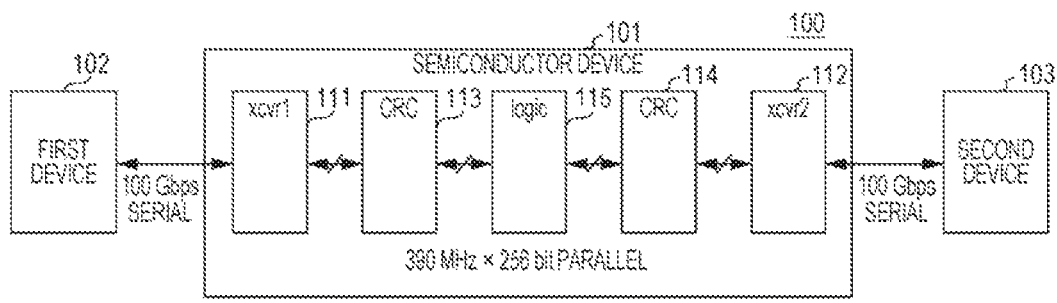
FIG. 6 is a diagram illustrating one example of a system including a semiconductor device to which CRC code calculation circuits according to a first embodiment are mounted.

FIG. 6 is a diagram illustrating one example of a system including a semiconductor device to which CRC code calculation circuits according to a first embodiment are mounted. The basic block configuration thereof is the same as that of FIG. 1A.

A system 100 includes a semiconductor device 101, a first device 102, and a second device 103. Each of the semiconductor device 101, the first device 102, and the second device 103 is a semiconductor device that allows signals to be serially transmitted at 100 Gbps. The semiconductor device 101 includes a first communication circuit 111, a second communication circuit 112, a first CRC circuit 113, a second CRC circuit 114, and a logic circuit 115. The first communication circuit 111, the second communication circuit 112, and the logic circuit 115 have configurations and functions the same as those of the first communication circuit 911, the second communication circuit 912, and the logic circuit 915 in FIG. 1A, and therefore detailed explanations are herein omitted. The second CRC circuit 114 has a configuration and a function as same as those of the first CRC circuit 113.

Figure 7A:
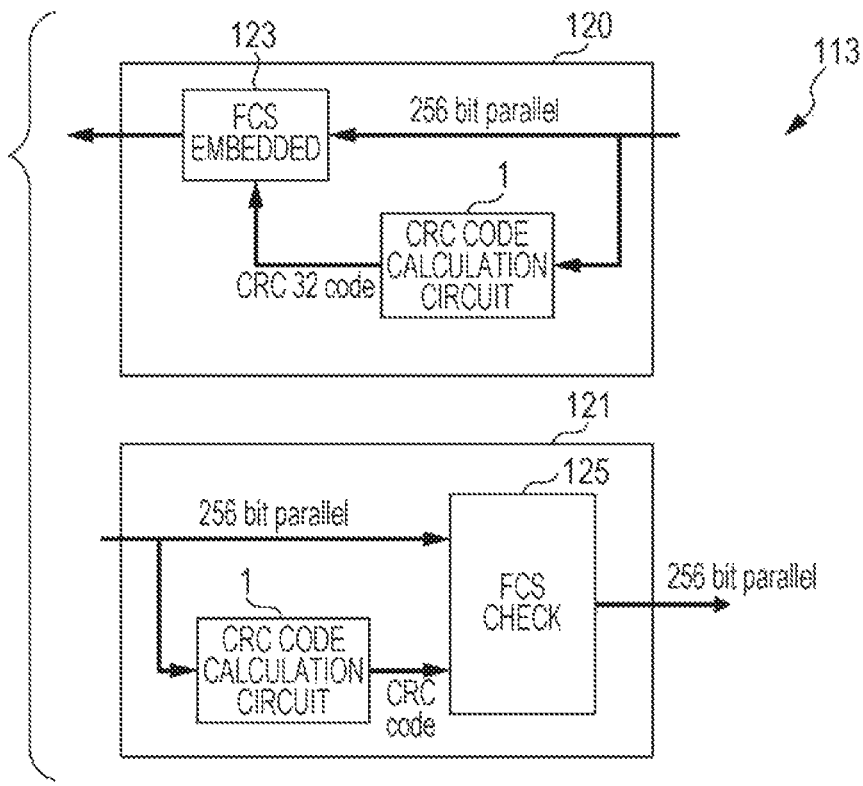
FIG. 7A is a circuit block diagram of a first CRC circuit illustrated in FIG. 6.
Figure 7B:
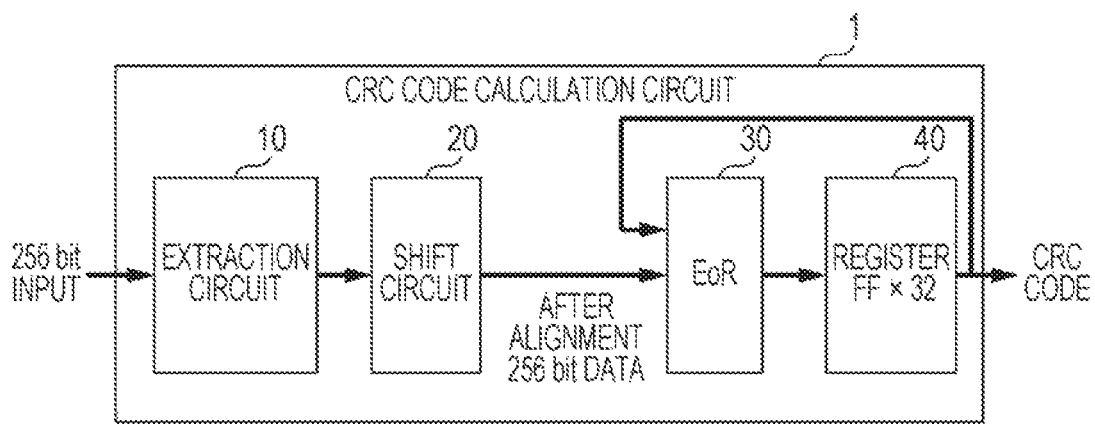
FIG. 7B is a circuit block diagram of a CRC code calculation circuit illustrated in FIG. 7A.

FIG. 7A is a circuit block diagram of the first CRC circuit 113, and FIG. 7B is a circuit block diagram of a CRC code calculation circuit illustrated in FIG. 7A.

The first CRC circuit 113 includes a CRC transmission unit 120, and a CRC reception unit 121. The CRC transmission unit 120 includes a CRC code calculation circuit 1, and an FCS embedded circuit 123. The CRC reception unit 121 includes the CRC code calculation circuit 1, and an FCS check circuit 125. The FCS embedded circuit 123 and the FCS check circuit 125 have configurations and functions the same as those of the FCS embedded circuit 923 and the FCS check circuit 925 in FIG. 2A, and therefore detailed explanations are herein omitted.

The CRC code calculation circuit 1 includes an extraction circuit 10, a shift circuit 20, an EoR circuit 30, and a register 40. The extraction circuit 10 extracts a calculation target packet that is a target of calculation from a signal frame inputted as a parallel signal having a predetermined bit length (for example, 256 bits). When a bit length of the calculation target packet does not match an integral multiple of 256 bits, the shift circuit 20 shifts the calculation target packet such that a last bit of the calculation target packet is positioned at a least significant bit. Next, the shift circuit 20 adds "0" to a most significant bit side of a head bit of the shifted calculation target packet to generate shift data having a bit length of an integral multiple of 256 bits. The EoR circuit 30 performs CRC code calculation on the shift data based on an initial value "0" stored in the register 40 to generate a CRC code of a second bit length (for example, 32 bits). The register 40 stores an initial value "0" before the calculation circuit generates a CRC code, and stores the CRC code after the calculation circuit generates the CRC code.

Figure 8:
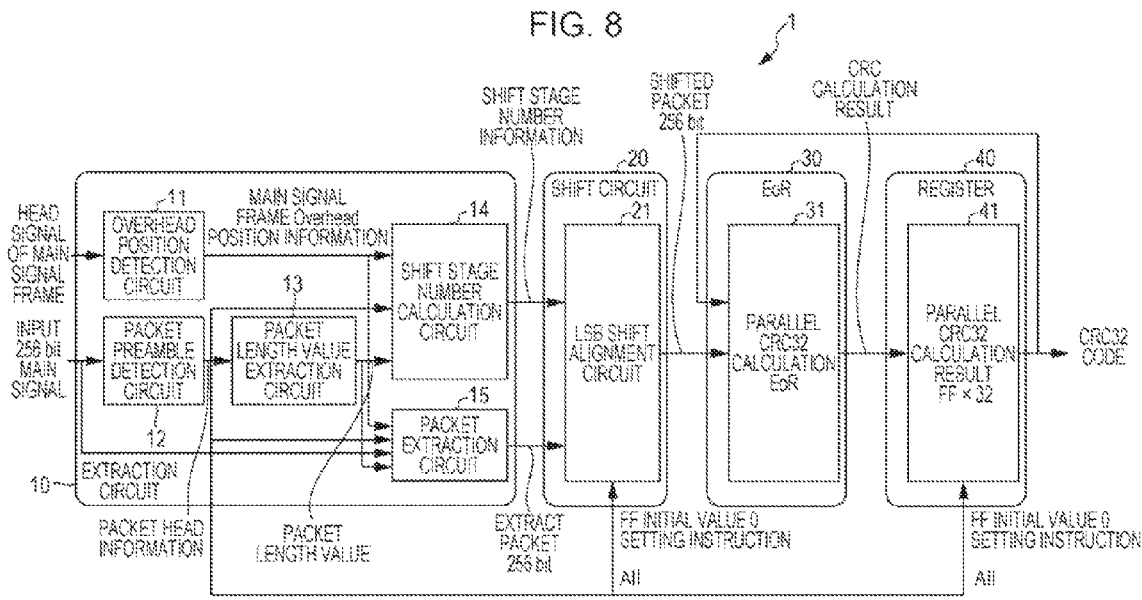
FIG. 8 is a more detailed circuit block diagram of the CRC code calculation circuit illustrated in FIG. 7B.

FIG. 8 is a more detailed circuit block diagram of the CRC code calculation circuit 1.

The extraction circuit 10 includes an overhead position detection circuit 11, a packet preamble detection circuit 12, a packet length value extraction circuit 13, a shift stage number calculation circuit 14, and a packet extraction circuit 15.

The overhead position detection circuit 11 includes a counter for detecting a position of an overhead that stores control information on a main signal frame that is a parallel signal of 256 bits. The overhead cyclically appears at a position apart by a predetermined number of bits from a head of the main signal frame, so that the overhead position detection circuit 11 counts the number of bits of the inputted main signal frame by the counter to detect a position of the overhead. The overhead position detection circuit 11 outputs signal frame overhead position information indicating the detected position of the overhead to the shift stage number calculation circuit 14 and the packet extraction circuit 15.

The packet preamble detection circuit 12 detects a preamble that includes a start frame delimiter (SFD) of "1010101010b" indicating a head of the packet from the main signal frame. A packet is present in a next and subsequent bytes to the preamble, so that the packet preamble detection circuit 12 generates information indicating a bit next to the preamble as packet head information. The packet preamble detection circuit 12 outputs the generated packet head information to the packet length value extraction circuit 13, the shift stage number calculation circuit 14, and the packet extraction circuit 15. Moreover, the packet preamble detection circuit 12 outputs an FF initial value instruction instructing to reset all the lip-flops to "0" to the shift circuit 20 and the register 40. Note that, there is a case where a circuit, such as a communication circuit, before the CRC code calculation circuit 1 may detect a position of a preamble of the packet. If the circuit before the CRC code calculation circuit 1 may detect a position of a preamble of the packet, the packet preamble detection circuit 12 may preferably be omitted.

The packet length value extraction circuit 13 extracts a packet length value indicating a length of a packet arranged at a predetermined position in the packet. The packet length value extraction circuit 13 outputs the extracted packet length value to the shift stage number calculation circuit 14 and the packet extraction circuit 15.

The shift stage number calculation circuit 14 calculates a stage number at which the packet is shifted to the LSB side from the signal frame overhead position information, the packet head information, and the packet length value. The main signal frame is a parallel signal of 256 bits, so that a maximum value of the shift amount is 32 bytes. The shift stage number calculation circuit 14 outputs shift stage number information that is the number of bytes obtained by subtracting the number of bytes indicated by the signal frame overhead position information from the number of bytes indicated by low-order 5 bits of the packet length value, to the shift circuit 20.

The packet extraction circuit 15 includes flip-flops connected in parallel and of 256 bits and of a plurality of stages. Based on the signal frame overhead position information, the packet head information, and the packet length value, the packet extraction circuit 15 extracts packets included in the main signal frame, and successively latches the packets into the flip-flops. The packet extraction circuit 15 outputs the latched packet as a packet that is a parallel signal of 256 bits to the shift circuit 20.

The shift circuit 20 includes an LSB shift alignment circuit 21 that includes flip-flops connected in parallel and of 256 bits and of a plurality of stages. The LSB shift alignment circuit 21 resets all the lip-flops to "0" when the FF initial value instruction is inputted thereto from the packet preamble detection circuit 12. The LSB shift alignment circuit 21 successively latches the packets inputted from the packet extraction circuit 15. The LSB shift alignment circuit 21 shifts and aligns the latched packets such that the LSB of the packet matches the LSB of the flip-flop based on the shift stage number information to generate shift data.

Figure 9:
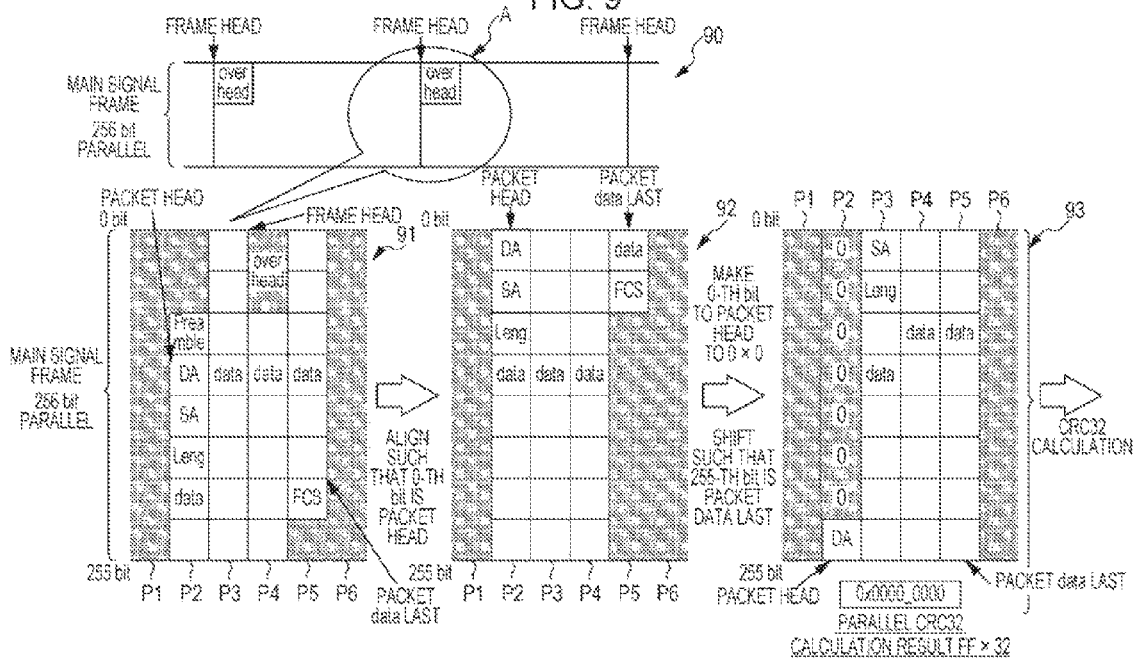
FIG. 9 is a diagram illustrating one example of movement of data due to processing of a packet by an extraction circuit and a shift circuit illustrated in FIG. 8.

FIG. 9 is a diagram illustrating one example of movement of data due to the processing of the packets by the extraction circuit 10 and the shift circuit 20. In FIG. 9, a signal sequence indicated by an arrow 90 indicates a main signal frame that is converted to a parallel signal of 256 bits in the first communication circuit 111, and a signal sequence indicated by an arrow 91 indicates an enlarged signal sequence of a portion surrounded by an arrow A in the signal sequence indicated by the arrow 90. A signal sequence indicated by an arrow 92 indicates a signal sequence that the packet extraction circuit 15 extracts from the signal sequence indicated by the arrow 91, and a signal sequence indicated by an arrow 93 indicates shift data that the shift circuit 20 shifts the signal sequence indicated by the arrow 91.

A packet formed by the signal sequence indicated by the arrow 91 is inputted into the packet extraction circuit 15. The signal sequence indicated by the arrow 91 includes a preamble, a destination address DA, a transmission source address SA, a length/type Leng, data, and an FCS. The data is arranged over from a second parallel signal P2 to a fifth parallel signal P5 in the signal sequence indicated by the arrow 91. A frame partition is present between a third parallel signal P3 and a fourth parallel signal P4, and an overhead is arranged over in a predetermined bit length from an MSB of the fourth parallel signal P4. The overhead is arranged in the fourth parallel signal P4 to divide the data.

The packet extraction circuit 15 determines a position of a head bit of a group of calculation target packets as a target of calculation that are arranged subsequent to a rear end of the preamble, from the packet head information inputted from the packet preamble detection circuit 12. The packet extraction circuit 15 determines a position of a last bit of the calculation target packet, from packet head information inputted from the packet preamble detection circuit 12 and a packet length value inputted from the packet length value extraction circuit 13. In this process, when the overhead of the signal frame is present in the calculation target packet, the packet extraction circuit 15 determines a position of a last bit of the calculation target packet by considering the bit length of the overhead. The packet extraction circuit 15 determines a position of the overhead of the main signal frame from signal frame overhead position information inputted from the overhead position detection circuit 11. The overhead is positioned in the data of the calculation target packet in the signal sequence indicated by the arrow 91, so that the packet extraction circuit 15 determines a position of a last bit of the calculation target packet by considering the bit length of the overhead. The packet extraction circuit 15 extracts the calculation target packet from the signal sequence indicated by the arrow 91 using the packet head information, the packet length value, and the signal frame overhead position information, and generates the signal sequence indicated by the arrow 92. The calculation target packet included in the signal sequence indicated by the arrow 92 has a head bit that is positioned at an MSB of the second parallel signal P2. The signal sequence indicated by the arrow 92 does not include the preamble and the overhead that are not the calculation target packet.

The shift circuit 20 generates a calculation target packet in which a calculation target packet extracted by the packet extraction circuit 15 is shifted using shift stage number information inputted from the shift stage number calculation circuit 14 such that a last bit of the calculation target packet matches an LSB of the parallel signal. The shift circuit 20 stores the shifted calculation target packet in the flip-flop that is reset to "0" to generate shift data that is the signal sequence indicated by the arrow 93. A calculation target packet included in the shift data that is the signal sequence indicated by the arrow 93 has a last bit that is positioned at the LSB of the fifth parallel signal. Moreover, the destination address DA that is positioned a head of the calculation target packet is positioned at the LSB side of the second parallel signal. The shift circuit 20 causes all the MSB sides of the second parallel signal P2 at which the head bit of the calculation target packet is positioned to be "0".

When a bit length of the calculation target packet does not match an integral multiple of 256 bits, the shift circuit 20 shifts the calculation target packet such that a last bit of the calculation target packet matches the least significant bit. Moreover, the shift circuit 20 adds "0" to a high-order side of the most significant bit of the shifted calculation target packet to generate shift data having a bit length of an integral multiple of 256 bits.

The EoR circuit 30 includes a parallel CRC32 calculation EoR circuit 31 that calculates the parallel signal of 256 bits inputted from the shift circuit 20 based on the CRC32 generating polynomial expressed by the expression (1) to generate a CRC code. For example, the parallel CRC32 calculation EoR circuit 31 calculates the shift data indicated by the arrow 93 to generate a CRC code. The calculation to generate a CRC code may be expressed by a calculation expression in which a remainder obtained by dividing data by a generating polynomial is the CRC code. In other words, when data is $F(x)$, a generating polynomial is $G(x)$, a quotient by division is $Q(x)$, and a CRC code that is a remainder is $R(x)$, the calculation expression is expressed by $$F(x)/G(x)=Q(x)+R(x) \qquad (2).$$

Figure 10A:
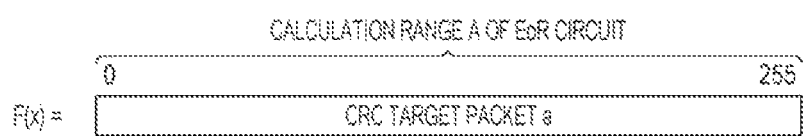
FIG. 10A is a diagram illustrating one example of a calculation target packet to be calculated.
Figure 10B:
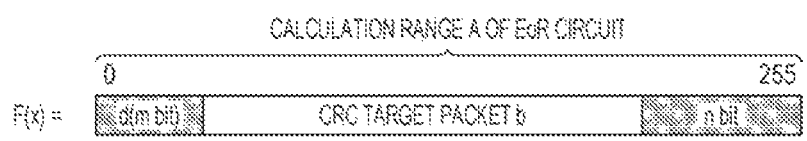
FIG. 10B is a diagram illustrating another example of a calculation target packet to be calculated.
Figure 10C:
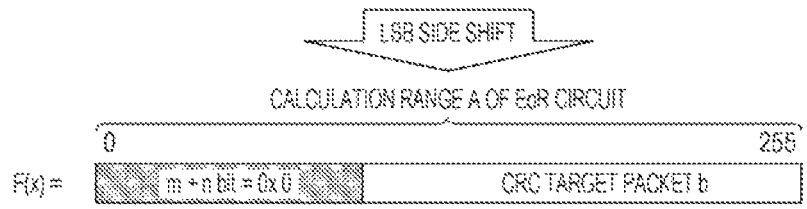
FIG. 10C is a diagram illustrating an example in which the calculation target packet illustrated in FIG. 10B is shifted.

FIG. 10A is a diagram illustrating one example of a calculation target packet to be calculated, FIG. 10B is a diagram illustrating another example of a calculation target packet to be calculated, and FIG. 10C is a diagram illustrating an example in which the calculation target packet illustrated in FIG. 10B is shifted.

When a packet that has a bit length of 256 bits as illustrated in FIG. 10A is calculated, the EoR circuit 30 is capable of generating a CRC code without shifting the packet because a calculation range A of the EoR circuit 30 matches a range of a calculation target packet a. However, as illustrated in FIG. 10B, when a packet having a bit length shorter than 256 bits is calculated, the EoR circuit 30 might generate an incorrect CRC code if the EoR circuit 30 does not shift the packet.

A calculation target packet b illustrated in FIG. 10B has a last bit that does not match an LSB in a calculation range of the CRC code calculation circuit, but is shifted by n bits. Moreover, data d of m bits is positioned at an MSB side of a head bit of the calculation target packet b illustrated in FIG. 10B. Therefore, in the example illustrated in FIG. 10B, a value of the calculation range A of the EoR circuit 30 is obtained by $$A = b \times 2^n + d \quad (3),$$

and the EoR circuit 30 calculates data different from the calculation target packet b to generate a CRC code different from that when the calculation target packet b is calculated. Execution of processing of an expression (4) that is obtained by deforming the expression (3) allows the EoR circuit 30 to generate a CRC code from the calculation target packet b indicated in the example illustrated in FIG. 10B without any error.

$$b = (A - d)/2^n \quad (4)$$

The EoR circuit 30 may generate a CRC code without any error by dividing the calculation target packet b by $2^n$, and calculating a packet in which the data d of m bits is positioned at the MSB side of the head bit of the calculation target packet b is subtracted from the calculation range A of the EoR circuit 30. In other words, the EoR circuit 30 calculates shift data of 256 bits in which the calculation target packet b is shifted by n bits to the LSB side and the MSB side of the head bit of the shifted calculation target packet b is made to "0" to generate a CRC code. In this manner, as illustrated in FIG. 10C, the calculation range A of the EoR circuit 30 is set such that the last bit of the calculation target packet b is positioned at the LSB side of the calculation range A of the EoR circuit 30 and the MSB side of the head bit of the calculation target packet b is made to "0". The EoR circuit 30 is capable of generating a CRC code from the calculation target packet b without any error by specifying the calculation range A as illustrated in FIG. 10C.

Note that, the bit length of the calculation target packets illustrated in FIGS. 10A and 10B are mere examples, and the group of calculation target packets may have a bit length longer than 256 bits or shorter than 256 bits. When a calculation target packet has a bit length longer than 256 bits, as illustrated in FIG. 9, similar to a case where the calculation target packet has a bit length shorter than 256 bits, the calculation target packet is shifted such that the last bit of the calculation target packet matches the LSB of the parallel signal.

The register 40 includes a parallel CRC32 calculation result storage circuit 41 that includes flip-flops connected in parallel and of 32 bits. The parallel CRC32 calculation result storage circuit 41 resets all the lip-flops to "0" when packet head information is inputted thereto from the packet preamble detection circuit 12. When a CRC code that is generated by calculation is inputted into the parallel CRC32 calculation result storage circuit 41 from the EoR circuit 30, the parallel CRC32 calculation result storage circuit 41 stores the inputted CRC code in the flip-flops connected in parallel and of 32 bits.

Figure 11B:
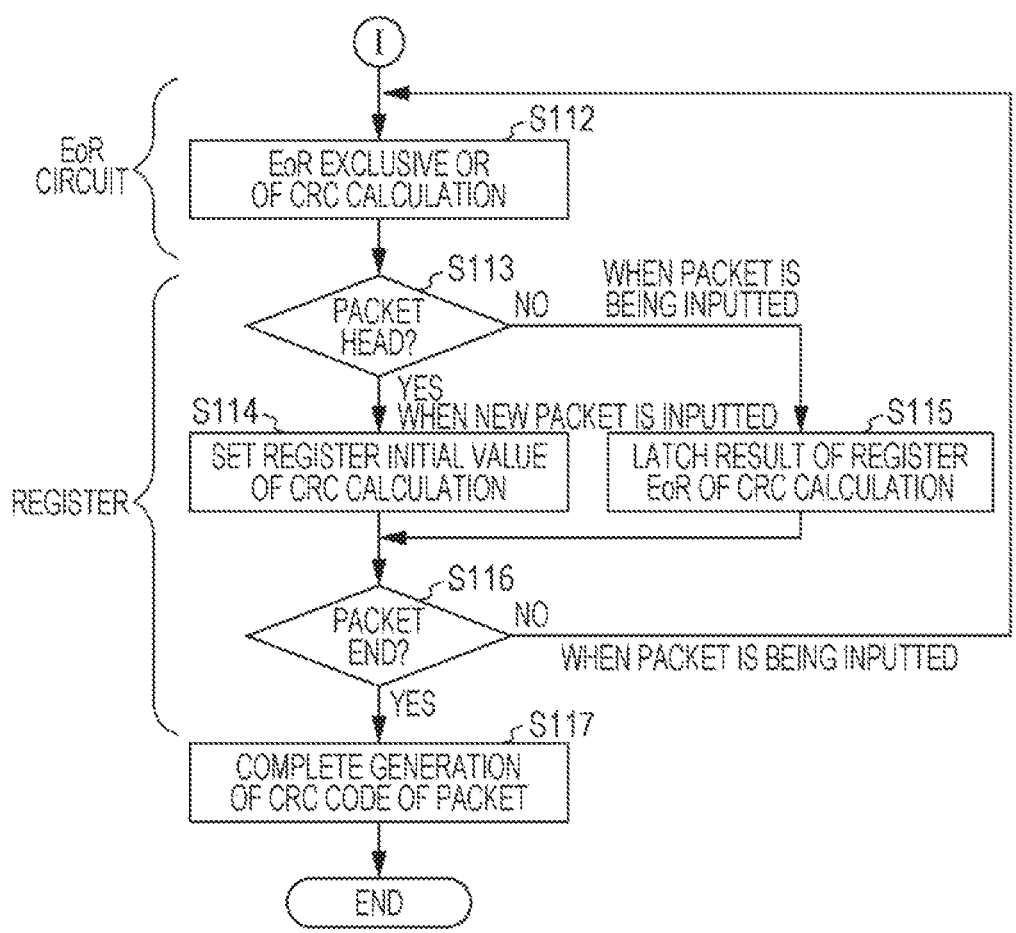

FIG. 11 is a flowchart illustrating processing in which the CRC code calculation circuit 1 generates a CRC code.

Firstly, a serial-parallel converted main signal frame is inputted into the CRC code calculation circuit 1 (S101). If determining that a CRC code is not being calculated (S102), the overhead position detection circuit 11 detects a position of an overhead of the main signal frame, and generates signal frame overhead position information (S103). Next, the packet preamble detection circuit 12 detects a position of a preamble (S104) and generates packet head information, and the packet length value extraction circuit 13 extracts a packet length value (S105). The shift stage number calculation circuit 14 calculates a stage number at which the packet is shifted to the LSB side from the signal frame overhead position information, the packet head information, and the packet length value (S106). The packet extraction circuit 15 extracts, based on the signal frame overhead position information, the packet head information, and the packet length value, a packet included in the main signal frame (S107). If the overhead position detection circuit 11 determines that a CRC code is being calculated (S102), the processes from S103 to S106 are omitted.

If determining that a head bit of a packet inputted from the extraction circuit 10 is inputted (S108), the shift circuit 20 updates a shift stage number (S109). Next, the shift circuit 20 resets all the lip-flops to "0", and thereafter shifts and aligns the packet such that an LSB of the packet matches an LSB of the flip-flop based on the shift stage number information to generate shift data (S110). The shift circuit 20 outputs shift data in which "0" is added to the MSB side of the shifted packet. If determining that a head bit of the packet inputted from the extraction circuit 10 is not inputted (S108), the shift circuit 20 outputs the stored packet for every 256 bits from the MSB side.

The EoR circuit 30 performs calculation based on a CRC32 generating polynomial to generate a CRC code (S112).

If determining that data including the head bit of the packet is calculated (S113), the register 40 sets "0" of 32 bits as an initial value (S114). Hereinafter, the register successively stores calculations result by the EoR circuit 30 (S115) until determining that the last bit of the packet is calculated (S116). If the register determines that last bit of the packet is calculated (S116), the register 40 outputs the stored data of 32 bits as a CRC code (S117).

(Functional Effects of CRC Code Calculation Circuit According to First Embodiment)

The CRC code calculation circuit according to the first embodiment is used for semiconductor devices of an FPGA, an application specific integrated circuit (ASIC), and the like, in a case where a packet having a variable length is encapsulated by a main signal frame or other cases. The CRC code calculation circuit according to the first embodiment is capable of reducing the circuit size of the CRC code calculation circuit for calculation to generate a CRC code from a calculation target packet.

Table 1 is a table in which the circuit sizes of the CRC code calculation circuit according to the first embodiment and a conventional CRC code calculation circuit are compared with each other.

TABLE 1

| Transmission Rate | | Parallel Width | Number of FFs | Number of Shift alignment FFs | Total Number of FFs | Note |
|---|---|---|---|---|---|---|
| 1 Gbps | Conventional | 16 | 64 | 0 | 64 | |
| 10 Gbps | Conventional | 32 | 128 | 0 | 128 | |
| | | 64 | 256 | 0 | 256 | |
| 100 Gbps | Conventional | 256 | 1024 | 0 | 1024 | |
| | Present Disclosure | 256 | 32 | 256 | 288 | approximately ¼ of Conventional |
| | Conventional | 512 | 2048 | 0 | 2048 | |
| | Present Disclosure | 512 | 32 | 512 | 544 | approximately ¼ of Conventional |

In the conventional CRC code calculation circuit, the bit the width does not become large as 1 Gbps transmission (62.5 MHz×16 parallel), 10 Gbps transmission (156.25 MHz×64 parallel, 312.5 MHz×32 parallel), or the like. This results in small increase in the circuit size even when EoR circuits are arranged in accordance with the bit lengths of the variable packets, such as the CRC code calculation circuit 940. However, when a CRC code is generated from a high-speed and large-capacity packet such as at 100 Gbps transmission in recent years, the bit width becomes large such as 512 bits, 256 bits, or the like. This results in increase in the circuit size when EoR circuits are arranged in accordance with the bit lengths of the variable packets, such as the CRC code calculation circuit 940. On the other hand, the CRC code calculation circuit according to the first embodiment may generate a CRC code with one EoR circuit, so that the circuit size may be reduced.

In the CRC code calculation circuit according to the first embodiment, the shift circuit shifts a calculation target packet to the LSB side, and thereafter, the EoR circuit generates a CRC code from the shifted calculation target packet. This allows the CRC code calculation circuit according to the first embodiment to generate a CRC code without any error by one-time packet shift, when one packet is divided into multiple parallel signals, as the packet illustrated in FIG. 9.

(Configuration and Function of Semiconductor Device and CRC Code Calculation Circuit According to Second Embodiment)

Figure 12:
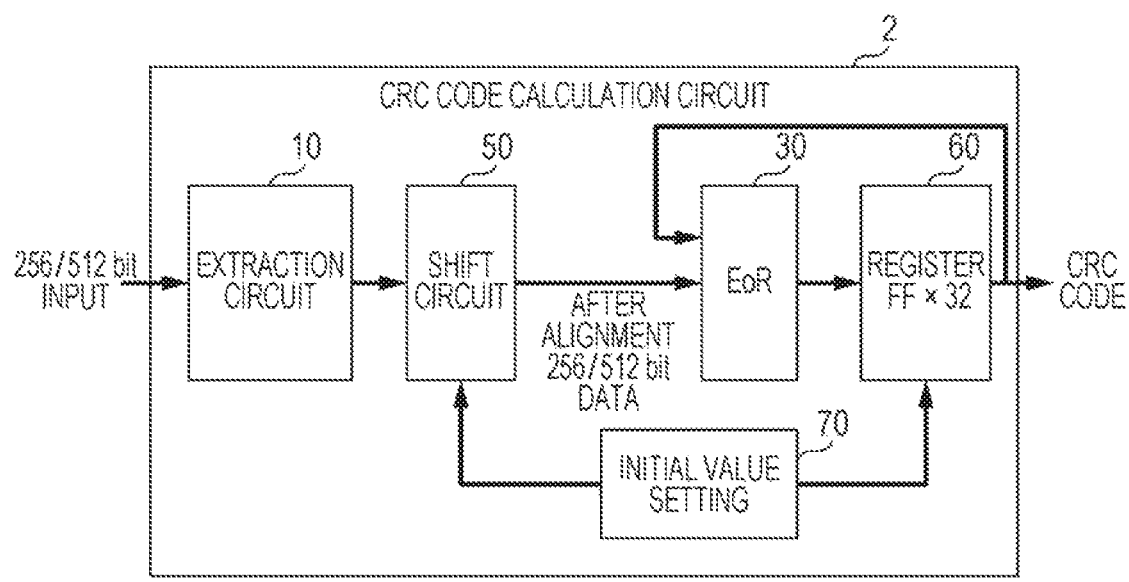
FIG. 12 is a circuit block diagram a CRC code calculation circuit according to a second embodiment.

FIG. 12 is a circuit block diagram of a CRC code calculation circuit according to a second embodiment that is capable of being mounted to the semiconductor device 101, instead of the CRC code calculation circuit 1 according to the first embodiment.

A CRC code calculation circuit 2 is different from the CRC code calculation circuit 1 in that a shift circuit 50, instead of the shift circuit 20, is arranged, and a register 60, instead of the register 40, is arranged. Moreover, the CRC code calculation circuit 2 is further different from the CRC code calculation circuit 1 in that an initial value setting circuit 70 is arranged. The configuration of the CRC code calculation circuit 2 other than the shift circuit 50, the register 60, and the initial value setting circuit 70 is similar to that of the CRC code calculation circuit 1, and therefore detailed explanations are herein omitted.

Figure 13:
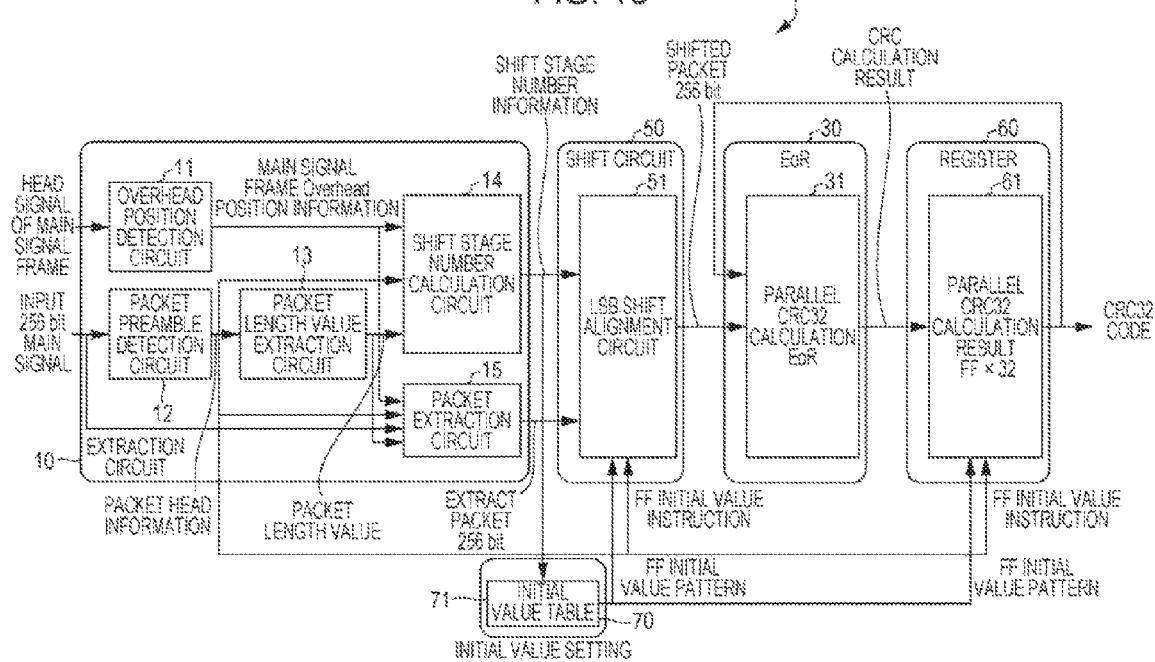
FIG. 13 is a more detailed circuit block diagram of the CRC code calculation circuit illustrated in FIG. 12.

FIG. 13 is a more detailed circuit block diagram of the CRC code calculation circuit 2.

The shift circuit 50 includes an LSB shift alignment circuit 51 that includes flip-flops connected in parallel and of 256 bits and of a plurality of stages. When the LSB shift alignment circuit 51 is inputted with an FF initial value instruction from the packet preamble detection circuit 12, the LSB shift alignment circuit 51 sets a shift circuit initial value in accordance with an FF initial value pattern inputted from the initial value setting circuit 70 to the flip-flops. The operation of the LSB shift alignment circuit 51 other than the operation when the FF initial value instruction is inputted is similar to that of the shift circuit 20, and therefore a detailed explanation thereof is herein omitted.

The register 60 includes a parallel CRC32 calculation result storage circuit 61 that includes flip-flops connected in parallel and of 32 bits. When the parallel CRC32 calculation result storage circuit 61 is inputted with an FF initial value instruction from the packet preamble detection circuit 12, the parallel CRC32 calculation result storage circuit 61 sets a shift circuit initial value in accordance with the FF initial value pattern inputted from the initial value setting circuit 70 to the flip-flops. The operation of the parallel CRC32 calculation result storage circuit 61 other than the operation when the FF initial value instruction is inputted is similar to that of the parallel CRC32 calculation result storage circuit 41, and therefore a detailed explanation thereof is herein omitted.

The initial value setting circuit 70 includes an initial value table 71. The initial value setting circuit 70 is inputted with shift stage number information from the shift stage number calculation circuit 14. When being inputted with shift stage number information, the initial value setting circuit 70 selects a shift circuit initial value and a register initial value in accordance with the inputted shift stage number information from the initial value table. Next, the initial value setting circuit 70 outputs the selected shift circuit initial value to the shift circuit 50, and outputs the selected register initial value to the register 60.

Table 2 is a table indicating the initial value table 71 when a packet with the FCS into which a CRC code calculated with all the initial values of "0" is embedded. Table 3 is a table indicating the initial value table 71 when a packet with the FCS into which a CRC code calculated with all the initial values of "1" is embedded.

TABLE 2

| | | Shift circuit initial value (byte out of CRC calculation range) | | | | |
|---|---|---|---|---|---|---|
| CRC initial value | Register initial value | −1 byte | −2 byte | −3 byte | −4 byte | −5 byte or after |
| All 0 | 0x0000_0000 | 0x00 | 0x00 | 0x00 | 0x00 | 0x00 |

TABLE 3

| | | Shift circuit initial value (CRC calculation out-of-range byte) | | | | | Note Difference when head byte of |
|---|---|---|---|---|---|---|---|
| CRC initial value | Register initial value | −1 byte | −2 byte | −3 byte | −4 byte | −5 byte or after | packet is 0 (shift stage number information) |
| All 1 | 0xFFF1_A90F | 0x64 | — | — | — | — | case where CRC calculation out-of range byte = 1 |
| | 0xFFDD_3859 | 0x64 | 0xF6 | — | — | — | case where CRC calculation out-of range byte = 2 |
| | 0xFF92_10C5 | 0x64 | 0xF6 | 0x7E | — | — | case where CRC calculation out-of range byte = 3 |
| | 0x0000_0000 | 0x49 | 0x64 | 0xAF | 0x46 | — | case where CRC calculation out-of range byte = 4 |
| | 0x0000_0000 | 0x49 | 0x64 | 0xAF | 0x46 | 0x00 | case where CRC calculation out-of range byte = 5 or more |

In Tables 2 and 3, a CRC initial value is an initial value that is used in calculation to generate a CRC code, a register initial value is an initial value that is outputted to the register 60, and a shift circuit initial value is an initial value that is outputted to the shift circuit 50. The register initial value and the shift circuit initial value are indicated using hexadecimal notation.

In a case of a packet in which all the initial values of "0" are calculated, the initial value setting circuit 70 selects, regardless of shift stage number information inputted from the shift stage number calculation circuit 14, all the values of "0" and of 32 bits as a register initial value, and selects all the values of "0" and of 256 bits as a register initial value.

In a case of a packet in which all the initial values of "1" are calculated, the initial value setting circuit 70 selects a register initial value and a shift circuit initial value in accordance with shift stage number information inputted from the shift stage number calculation circuit 14. The register initial value and the shift circuit initial value are specified such that a CRC code that the EoR circuit 30 generates using the register initial value from shift data is identical with a CRC code that is generated from a calculation target packet using an initial value of "1" and having a bit length of 32 bits. When the shift stage number information indicates a shift by 1 byte, the initial value setting circuit 70 selects "FFF1_A90F" in hexadecimal notation as a register initial value, and selects "64" in hexadecimal notation as a shift circuit initial value at the MSB side by 1 byte from the head bit of the calculation target packet. When the shift stage number information indicates a shift by 2 bytes, the initial value setting circuit 70 selects "FFDD_3859" in hexadecimal notation as a register initial value, and selects "64" and "F6" in hexadecimal notation as shift circuit initial values at the MSB side by 1 byte and 2 bytes from the head bit of the calculation target packet. When the shift stage number information indicates a shift by 3 bytes, the initial value setting circuit 70 selects "FF92_10C5" in hexadecimal notation as a register initial value. Moreover, the initial value setting circuit 70 selects "64", "F6", and "7E" in hexadecimal notation respectively as shift circuit initial values of the MSB side by 1 byte to 3 bytes from the head bit of the calculation target packet. When the shift stage number information indicates a shift by 4 bytes, the initial value setting circuit 70 selects "0000_0000" in hexadecimal notation as a register initial value. Moreover, the initial value setting circuit 70 selects "49", "64", "AF", and "46" in hexadecimal notation respectively as shift circuit initial values of the MSB side by 1 byte to 4 bytes from the head bit of the calculation target packet. When the shift stage number information indicates a shift by 5 bytes or more, the initial value setting circuit 70 selects "0000_0000" in hexadecimal notation as a register initial value. Moreover, the initial value setting circuit 70 selects "49", "64", "AF", and "46" in hexadecimal notation respectively as shift circuit initial values of the MSB side by 1 byte to 4 bytes from the head bit of the calculation target packet, and selects a value to which "00" is added in accordance with the MSB shift amount by 5 bytes or more.

Figure 14:
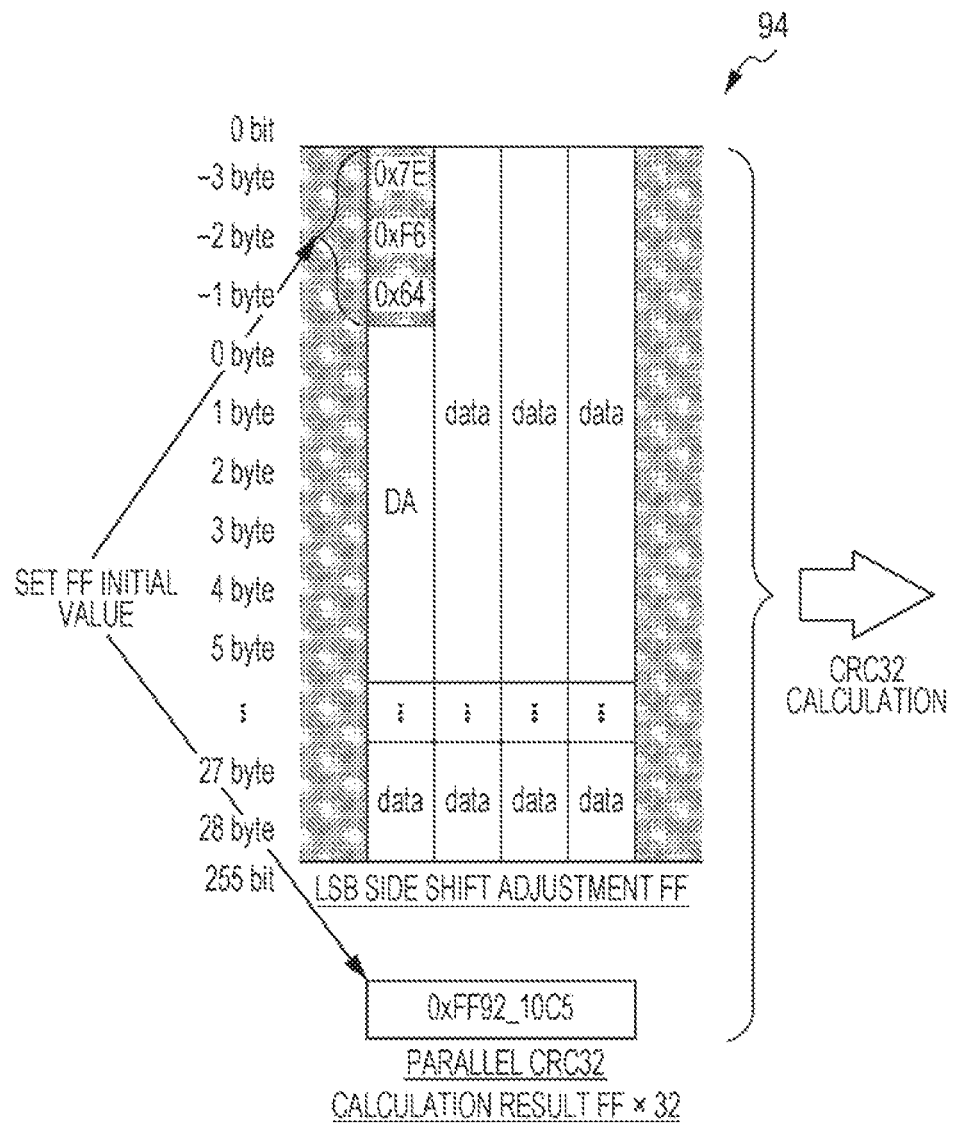
FIG. 14 is a diagram illustrating one example of data generated by a shift circuit illustrated in FIG. 12.

FIG. 14 is a diagram illustrating shift data that is generated when a packet in which the all initial values of "1" are calculated is shifted by 3 bytes in the shift circuit 50.

Shift circuit initial values are arranged from a bit that is lower order of an MSB of a second parallel signal P2 by 3 bytes to the MSB of the second parallel signal P2 in a signal sequence 94. "7E", "F6" and "64" in hexadecimal notation are sequentially arranged from the MSB side of the second parallel signal P2.

(Functional Effects of CRC Code Calculation Circuit According to Second Embodiment)

The CRC code calculation circuit according to the second embodiment may generate a CRC code using a shift circuit initial value and a register initial value that are stored in the initial value table, and therefore may calculate a CRC code corresponding to a CRC code that is generated using an initial value with all the values of "1". When a CRC code is generated using an initial value with all the values of "0", a CRC code that is calculated using the expression (2) is "0", and there is a case where a determination as to whether the generated CRC code is correct or not is not easy. The CRC code calculation circuit according to the second embodiment is capable of calculating a CRC code corresponding to a CRC code that is generated using an initial value with all the values of "1", and therefore is capable of generating a CRC code that may be easily determined as to whether the generated CRC code is correct or not.

Moreover, The CRC code calculation circuit according to the second embodiment is capable of setting desired values as a shift circuit initial value and a register initial value, and therefore is capable of calculating a CRC code corresponding to a CRC code that is generated using an initial value other than the initial value with all the values of "0" or "1".

(Modification Example of CRC Code Calculation Circuit According to Embodiments)

In the CRC code calculation circuits according to the first embodiment and the second embodiment, the EoR circuit 30 calculates CRC32, however, the CRC code calculation circuits according to the embodiments may preferably generate a CRC code by calculation such as CRC16 in accordance with the CRC code that is embedded into the FCS. Moreover, one example of the semiconductor device 101 to which the CRC code calculation circuits according to the embodiments are mounted is the FPGA, however, the CRC code calculation circuits according to the embodiments may preferably be mounted to another semiconductor device such as the ASIC.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A CRC code calculation circuit comprising:
an extraction circuit that extracts a calculation target packet that is a target of CRC calculation from a signal frame inputted as a parallel signal of a first bit length;
a shift circuit that generates, when a bit length of the calculation target packet does not match an integral multiple of the first bit length, data A of a bit length that is the integral multiple of the first bit length by shifting the calculation target packet such that a last bit of the calculation target packet is positioned at a least significant bit, and adding a shift circuit initial value to a most significant bit side of a head bit of the shifted calculation target packet;
a register; and
a calculation circuit that generates a CRC code by performing a CRC calculation on the data A based on a register initial value stored in the register, wherein
the register stores the register initial value before the calculation circuit generates the CRC code, and stores the CRC code after the calculation circuit generates the CRC code.

2. The CRC code calculation circuit according to claim 1, wherein the shift circuit initial value and the register initial value are "0".

3. The CRC code calculation circuit according to claim 1, further comprising an initial value setting circuit that stores the register the register initial value and the shift circuit initial value, wherein
the register initial value and the shift circuit initial value are specified such that a CRC code that the calculation circuit generates by calculating the data A using the register initial value is identical with a CRC code that is generated by performing CRC calculation on the calculation target packet based on the register initial value.

4. The CRC code calculation circuit according to claim 1, wherein the register initial value is data of a second bit length.

5. The CRC code calculation circuit according to claim 3, wherein the register initial value is data of a second bit length and with all "1".

6. The CRC code calculation circuit according to claim 1, wherein the extraction circuit includes a shift amount determination circuit that determines a shift amount by which the calculation target packet is shifted using signal frame overhead position information indicating a position of an overhead of the signal frame, packet length information indicating a packet length of the calculation target packet, and head position information indicating a position of a head bit of the calculation target packet in the signal frame.

7. The CRC code calculation circuit according to claim 6, wherein the extraction circuit further includes a packet extraction circuit that extracts the calculation target packet from the signal frame using the signal frame overhead position information, the packet length information, and the head position information.

8. A semiconductor device comprising:
a communication circuit that converts a serially transmitted signal frame to a parallel signal of a first bit length;
an extraction circuit into which the signal frame that is converted to the parallel signal is inputted from the communication circuit, and that extracts a calculation target packet that is a target of CRC calculation from the inputted signal frame;
a shift circuit that, when a bit length of the calculation target packet does not match an integral multiple of the first bit length, generates data A of a bit length that is the integral multiple of the first bit length by shifting the calculation target packet such that a last bit of the calculation target packet is positioned at a least significant bit, and adding "0" to a most significant bit side of a head bit of the shifted calculation target packet;
a register; and
a calculation circuit that generates a CRC code by performing a CRC calculation on the data A based on an initial value "0" stored in the register, wherein
the register stores the initial value "0" before the calculation circuit generates the CRC code, and stores the CRC code after the calculation circuit generates the CRC code.

9. A CRC code calculation method comprising:
extracting a calculation target packet that is a target of CRC calculation from a signal frame inputted as a parallel signal of a first bit length;
generating, when a bit length of the calculation target packet does not match an integral multiple of the first bit length, data A of a bit length that is integral multiple of the first bit length by shifting the calculation target packet such that a last bit of the calculation target packet is positioned at a least significant bit, and adding "0" to a most significant bit side of a head bit of the shifted calculation target packet;
generating a CRC code by calculating the data A based on an initial value "0" stored in a register, and
outputting the CRC code.

* * * * *